Figure 1:
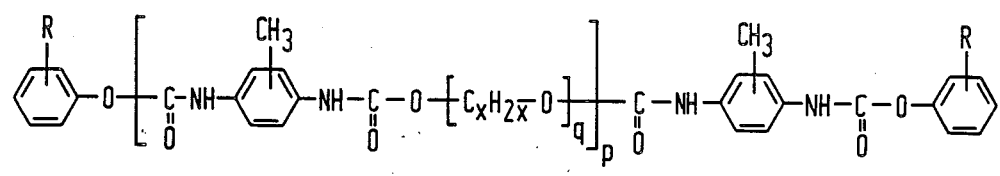

United States Patent [19]

Simons

[11] Patent Number: 4,876,319

[45] Date of Patent: Oct. 24, 1989

[54] SYNTHETIC RESIN COMPOSITION, SUBSTRATE MATERIAL FOR PRINTED CIRCUIT BOARDS AND METHOD OF MANUFACTURING A SYNTHETIC RESIN COMPOSITION

[75] Inventor: Johannes M. M. Simons, Sittard, Netherlands

[73] Assignee: U.S. Philips Corp., New York, N.Y.

[21] Appl. No.: 64,359

[22] Filed: Jun. 22, 1987

[30] Foreign Application Priority Data

Jul. 14, 1986 [NL] Netherlands ............................ 8601829

[51] Int. Cl.$^4$ ...................... C08F 283/04; C08L 61/00
[52] U.S. Cl. ...................................... 525/456; 427/96; 428/425.1; 428/425.3; 428/901
[58] Field of Search .................. 525/456, 504; 427/96; 428/901

[56] References Cited

U.S. PATENT DOCUMENTS 4,173,594 11/1979 Dyszlewski .......................... 525/498
4,440,833 4/1984 Franz et al. ...................... 428/425.1

*Primary Examiner*—Theodore E. Pertilla
*Attorney, Agent, or Firm*—Ernestine C. Bartlett

[57] ABSTRACT

The invention relates to a synthetic resin composition comprising a phenol-formaldehyde resin and a polyurethane component, and to a substrate material for printed circuit boards, comprising a fibrous carrier material which is impregnated with such a synthetic resin composition derived from the reaction of a phenol and a formaldehyde-producing compound in the presence of the polyurethane component and a basic catalyst to form an interpolymer which upon further processing yields a substrate material which is on the one hand suitable to be provided with holes by punching and piercing and on the other is not subject to an objectionable degree of sagging during the soldering of components onto the printed circuit board by means of a wave-soldering bath.

9 Claims, 1 Drawing Sheet

SYNTHETIC RESIN COMPOSITION, SUBSTRATE MATERIAL FOR PRINTED CIRCUIT BOARDS AND METHOD OF MANUFACTURING A SYNTHETIC RESIN COMPOSITION

FIELD OF THE INVENTION

The invention relates to a synthetic resin composition comprising a phenol-formaldehyde resin and a polyurethane component.

The invention also relates to a substrate material for printed circuit boards, comprising a fibrous carrier material which is impregnated with such a synthetic resin composition.

The invention further relates to a method of manufacturing a synthetic resin composition which comprises a phenol-formaldehyde resin and a polyurethane component.

BACKGROUND OF THE INVENTION

German Patent Specification DE No. 3,143,121 which corresponds to U.S. Pat. No. 4,440,833, describes such a synthetic resin composition and a fibrous substrate material for printed circuit boards, in particular paper, in which a phenol-formaldehyde resin is impregnated which is mixed with a softening polyurethane component to allow for, for example, holes to be punched or pierced in the material without the substrate material becoming torn at the edges of the holes.

A disadvantage of such a material to which a softener is added, is the higher degree of sagging of the material, in particular at a higher temperature, for example, over a wavesoldering bath as used to attach electric and electronic components to the printed circuit board.

SUMMARY OF THE INVENTION

An object of the invention is to provide a synthetic resin composition and a substrate material manufactured therewith, which is suitable on the one hand for the provision of holes by punching and piercing and on the other is not subject to an objectionable degree of sagging during the soldering of components onto the printed circuit board by means of a wavesoldering bath.

This object is achieved in accordance with the invention by means of a synthetic resin composition and a substrate material for printed circuit boards comprising a fibrous carrier material which is impregnated with such a synthetic resin composition which are characterized in that the synthetic resin composition is an interpolymer of the phenol-formaldehyde resin and the polyurethane component.

In comparison with the synthetic resin composition in accordance with the present state of the art, the synthetic resin composition and the substrate material in accordance with the invention have the additional advantage that the resistance to high temperatures is improved.

The expression phenol-formaldehyde resin is to be understood to include synthetic resins which are manufactured from a substituted phenol, for example cresol. Instead of or in addition to paper, for example, a mat of glass fibres may be used as a fibrous material in the substrate material for printed circuit boards.

A further object of the invention is to provide a method of manufacturing a synthetic resin composition, by means of which an interpolymer can be readily manufactured from a phenol-formaldehyde resin and a polyurethane component.

This object is achieved in accordance with the invention by a method which is characterized in that the phenol-formaldehyde resin is prepared from a phenol and a formaldehyde-producing compound in the presence of the polyurethane component and a basic catalyst.

In a preferred embodiment of the method in accordance with the invention, a quantity of the formaldehyde-producing compound is used per mol of phenol, which produces from 1 to 1.6 mol of formaldehyde and from 0.005 to 0.02 mol of the polyurethane component is used per mol of phenol.

A substituted phenol, such as cresol, may also be used, for example, as a phenol. Formalin, metaformaldehyde or paraform may be used, for example, as formaldehyde-producing components. Suitable basic catalysts are, for example, ammonia and primary, secondary and tertiary amines. Common components such as flame retardants, softeners and a low-molecular phenol resin may be added to the synthetic resin composition in accordance with the invention.

Figure 2:
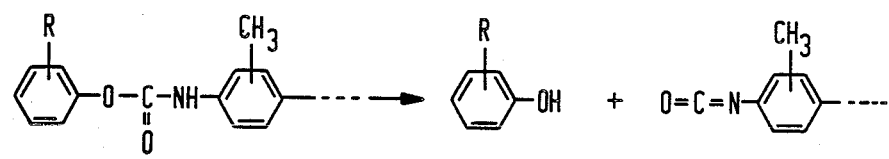

The invention will now be described in more detail with reference to an exemplary embodiment and a drawing, in which FIG. 1 is the structural formula of a suitable polyurethane component, and in which FIG. 2 is a step in the reaction mechanism for the formation of an interpolymer.

EXAMPLE

The following starting materials are used for the preparation of an interpolymer from a phenol-formaldehyde resin and a polyurethane component:

10 mol of phenol, in the form of a 89% by weight solution in water;

12 mol of formaldehyde, in the form of 91% by weight of paraform;

0.05 mol of triethylene tetraamine;

0.05 mol of triethylamine;

0.20 mol of polyurethane.

Instead of or in addition to phenol also a cresol, for example m-cresol, or another substituted phenol can be used. The formaldehyde may also be added in the form of an aqueous solution, for example formalin having a concentration of 37% by weight. Instead of the above-mentioned amines, for example, from 0.5 to 1.0 mol of ammonia may also be used.

The polyurethane is, for example, the compound with the structural formula indicated in FIG. 1, where R is an alkyl group having 4 to 12 carbon atoms, for example a $-C_9H_{19}$ group, and where p is an integer from 0 to 2, where q is an integer from 10 to 30 and where x is an integer from 2 to 6. A branched group, such as $-(CH_2-CH(CH_3)-O)_q-$ may also be used as a polyol component $-(C_xH_{2x}O)_q-$ in the polyurethane.

The above-mentioned materials are mixed, after which the mixture is kept on the boil at a temperature of 90° C. for 60 minutes.

The polyurethane decomposes partly due to the heat supplied, thereby forming an alkylated phenol and an isocyanate compound (see FIG. 2). The alkylated phenol may react with formalin and then with methylolphenol. The isocyanate compound may also react with methylolphenol which is an intermediate product formed during the reaction of phenol with formaldehyde. Due to this mechanism the polyurethane component is incorporated in the phenol-formaldehyde resin formed.

After boiling the mixture, the solvents and the residue of the starting materials, predominantly phenol and formaldehyde, are substantially removed by vacuum distillation. Common components such as flame retardants may be added to the synthetic resin composition.

By impregnating paper with the synthetic resin composition produced and applying a copper layer, for example by bonding a copper foil with an acrylate adhesive, by applying a high pressure and at a high temperature (140° to 170° C.) a substrate material for printed circuit boards is obtained which is highly temperature-resistant and in which holes can suitably be formed by punching and piercing, and which has also other favourable properties, for example concerning water absorption, dimensional stability during etching of the copper layer and at variations in temperature, and concerning solder-bath resistance. The resistance to tin baths at a temperature of 260° C. of the substrate material in accordance with the invention is at least twice that of a substrate material in which the polyurethane component is not mixed with the phenol-formaldehyde resin until after the production of the latter.

The degree of sagging at a high temperature is established as follows. By means of etching, the copper layer is removed from a sample measuring 210×245 mm, after which it is kept at a temperature of 50° C. for 4 hours. Subsequently, the sample is positioned horizontally and supported at its large side by flat rods which are arranged at intervals of 195 mm. Next, the sample is heated to a temperature of 110 C. in 72 seconds and it is subjected to a central load of 800 g. Sagging is measured after 72 seconds to an accuracy of 0.1 mm. The amount of sagging of the substrate material in accordance with the invention is 3.5 and 6.2 mm, respectively, dependent upon the preferential direction of the fibres in the substrate material. In a substrate material which differs only from the one described above in that the polyurethane component is not boiled during the preparation of the phenol-formaldehyde resin, sagging amounts to 5.5 and 8.8 mm, respectively.

Consequently, the substrate material in accordance with the invention is suitable for use in printed circuit boards which on the one hand are to be provided with holes by punching or piercing and on the other are to be subjected readily to a wavesoldering process.

What is claimed is:

1. A method of manufacturing a synthetic resin composition which comprises an interpolymer of a phenol-formaldehyde resin and polyurethane which comprises reacting a phenol and a formalehyde-producing compound in the presence of a polyurethane and a basic catalyst.

2. A method as claimed in claim 1, wherein said polyurethane is selected from polyurethanes having the general structural formula

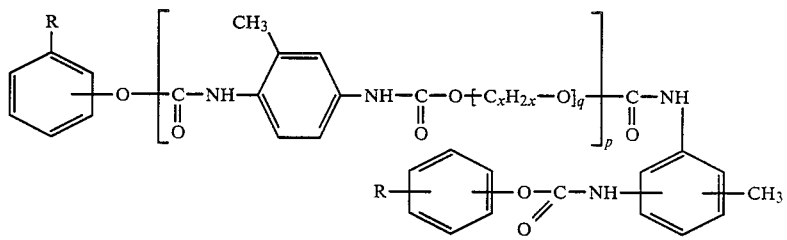

wherein R is an alkyl group having 4 to 12 carbon atoms, q is an integer from 10 to 30, p is an integer from 0 to 2, x is an integer from 2 to 6 and $(C_xH_{2x}O)q$ is optionally, a branched alkyloxy group.

3. A method as claimed in claim 2 wherein a quantity of formaldehyde-producing compound is used that is sufficient to produce from 1 to 1.6 mol of formaldehyde per mol of the phenol and from 0.005 to 0.02 mol of the polyurethane per mol of the phenol is employed.

4. A method as claimed in claim 3 wherein the reaction is conducted at elevated temperature.

5. A method of manufacturing a synthetic resin composition which comprises an interpolymer of a phenol-formaldehyde resin and a polyurethane component which comprises reacting a reaction mixture comprising 10 mols of phenol, 12 mols of formaldehyde, 0.05 mol triethylene tetramine, 0.05 mol triethylamine and 0.20 mol of a polyurethane at a temperature of 90° C. for about 1 hour.

6. A method as claimed in claim 5, wherein the polyurethane has the general formula

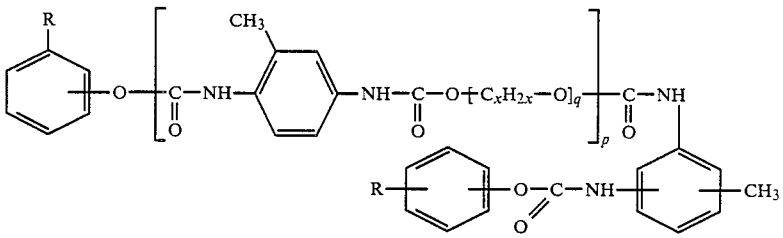

wherein R is an alkyl group having 4 to 12 carbon atoms, q is an integer from 10 to 30, p is an integer from 0 to 2, x is an integer from 2 to 6 and $(C_xH_{2x}O)q$ is optionally, a branched alkyloxy group.

7. A method as claimed in claim 6, wherein a cresol is substituted for the phenol, the formaldehyde is in the form of formalin having a concentration of 37% by weight and 0.5 to 1.0 mol of ammonia is substituted for triethylene tetramine and triethyl amine.

8. A synthetic resin composition comprising an interpolymer of a phenol-formaldehyde resin and polyurethane produced by the method of claim 1, 2 or 3.

9. A synthetic resin composition comprising an interpolymer of a phenol-formaldehyde resin and a polyurethane component produced by the method of claim 5, 6 or 7.

* * * * *